(12) United States Patent
Oda

(10) Patent No.: US 7,902,745 B2
(45) Date of Patent: Mar. 8, 2011

(54) ORGANIC ELECTROLUMINESCENT UNIT, METHOD FOR MANUFACTURING ORGANIC ELECTROLUMINESCENT UNIT, AND ELECTRONIC APPARATUS

(75) Inventor: Toshihiro Oda, Fujimi-machi (JP)

(73) Assignee: Seiko Epson Corporation, Tokyo (JP)

( * ) Notice: Subject to any disclaimer, the term of this patent is extended or adjusted under 35 U.S.C. 154(b) by 251 days.

(21) Appl. No.: 12/170,846

(22) Filed: Jul. 10, 2008

(65) Prior Publication Data
US 2009/0021155 A1    Jan. 22, 2009

(30) Foreign Application Priority Data
Jul. 20, 2007    (JP) ................ 2007-189154

(51) Int. Cl.
*H01L 51/52*    (2006.01)
(52) U.S. Cl. ........................... 313/504; 445/24
(58) Field of Classification Search ............. 257/40, 257/72, 98–100, 642–643, 759; 427/58, 427/64, 66, 532–535, 539; 428/690–691, 917; 438/24–25, 26–29, 34, 82; 445/24–25; 315/169.1, 169.3; 313/498–512
See application file for complete search history.

(56) References Cited

U.S. PATENT DOCUMENTS

| | | | | |
|---|---|---|---|---|
| 6,023,073 | A | * | 2/2000 | Strite ............................. 257/40 |
| 2006/0017377 | A1 | * | 1/2006 | Ryu .............................. 313/504 |
| 2007/0007538 | A1 | * | 1/2007 | Ono et al. ...................... 257/79 |
| 2007/0159085 | A1 | * | 7/2007 | Kuma et al. .................. 313/506 |

FOREIGN PATENT DOCUMENTS
JP    A-2004-335475    11/2004
* cited by examiner

*Primary Examiner* — Nimeshkumar D Patel
*Assistant Examiner* — Donald L Raleigh
(74) *Attorney, Agent, or Firm* — Oliff & Berridge PLC (57) ABSTRACT

An organic electroluminescent unit includes an anode, a cathode, a light-emitting layer disposed between the anode and the cathode, a hole transport layer disposed between the anode and the light-emitting layer, and a hole transport layer-protecting layer disposed between the hole transport layer and the light-emitting layer.

12 Claims, 4 Drawing Sheets

ORGANIC ELECTROLUMINESCENT UNIT, METHOD FOR MANUFACTURING ORGANIC ELECTROLUMINESCENT UNIT, AND ELECTRONIC APPARATUS

BACKGROUND

1. Technical Field

The present invention relates to an organic electroluminescent unit (hereinafter referred to as an organic EL unit), a method for manufacturing the organic EL unit, and an electronic apparatus.

2. Related Art

Organic EL devices, that is, organic light-emitting diodes (OLEDs) are attracting much attention because they can be used as light sources for thin, lightweight displays. Full-color displays including the organic EL devices have the following advantages: (1) high color purity, (2) no viewing-angle dependence, and (3) low power consumption. However, the full-color displays have a disadvantage that their lifetimes are short.

There are various possible causes for the fact that the organic EL devices have a short lifetime. For example, light-emitting layers are deteriorated by oxygen or moisture. It is known that the surfaces of the light-emitting layers are degraded during the period from the completion of the light-emitting layers to the formation of electron transport layers. JP-A-2004-335475 (hereinafter referred to as Patent Document 1) discloses a technique in which an emission-protecting layer is formed immediately after the completion of the light-emitting layer so as to protect the surface of the light-emitting layer from contamination.

There are other causes for the fact that the organic EL devices have a short lifetime. The inventors have found that the following devices have different lifetimes: an organic EL device including a light-emitting layer formed within a short time after the completion of a hole transport layer and an organic EL device including a light-emitting layer formed within a relatively long time (for example, about 30 minutes) after the completion of a hole transport layer. Although the reason for the difference therebetween is not clear, the inventors assume the reason for the difference therebetween to be that in the latter one, the surface of the hole transport layer is degraded during the period from the completion of the hole transport layer to the formation of the light-emitting layer, which is degraded because of the degradation of the hole transport layer. Although hole transport layers and light-emitting layers are formed in a vacuum if being formed by, for example, vapor deposition, the hole transport layers may be degraded by a minute amount of oxygen or moisture after the completion of the light-emitting layers. According to the technique disclosed in Patent Document 1, the emission-protecting layer protects the light-emitting layer; however, this technique is ineffective in preventing or suppressing the hole transport layer from being degraded and the light-emitting layer from being degraded due to the degradation of the hole transport layer.

It is known that a light-emitting layer made of a low-molecular-weight material contains a host material and a guest material (a dopant) and holes and electrons recombine with each other in molecules of the dopant to emit light. Since the host material and the dopant are mixed together by co-deposition, it takes a long time to stabilize the deposition rates of these materials. Therefore, this light-emitting layer cannot be necessarily formed immediately after the completion of a hole transport layer.

SUMMARY

An advantage of an aspect of the present invention is to provide an organic EL unit including a light-emitting layer having a long lifetime. An advantage of another aspect of the present invention is to provide a method for manufacturing the organic EL unit.

An organic EL unit according to a first aspect of the present invention includes an anode, a cathode, a light-emitting layer disposed between the anode and the cathode, a hole transport layer disposed between the anode and the light-emitting layer, and a hole transport layer-protecting layer disposed between the hole transport layer and the light-emitting layer. Since the hole transport layer-protecting layer is disposed between the hole transport layer and the light-emitting layer, the hole transport layer can be protected by the hole transport layer-protecting layer from being degraded. Even if the hole transport layer is degraded, the light-emitting layer can be prevented from being adversely affected by the degraded hole transport layer. This allows the light-emitting layer to have a long lifetime. The hole transport layer may have a function of transporting holes and a function of injecting the holes.

The hole transport layer-protecting layer is preferably made of a host material used to form the light-emitting layer. It is known that light-emitting layers with a low molecular weight contain a host material and a guest material (a dopant) and holes and electrons recombine with each other in molecules of the dopant to emit light. The host material has higher exciton resistance and electron resistance as compared to a hole transport material. When being made of the host material, the hole transport layer-protecting layer, unlike a layer made of the hole transport material, is not rapidly deteriorated even if surface portions of the hole transport layer-protecting layer are degraded and electrons and/or excitons migrating from the light-emitting layer are trapped at trapping sites formed in the degraded surface portions. The use of the host material to form the hole transport layer-protecting layer allows the energy gap between the HOMO or LUMO level of the light-emitting layer and that of the hole transport layer-protecting layer to be minimized. This prevents the electrons and holes from accumulating at the interface between the hole transport layer-protecting layer and the light-emitting layer, thereby preventing the deterioration of the interface therebetween.

An organic EL unit according to a second aspect of the present invention includes a plurality of light-emitting devices each including an anode, a portion of a cathode, a light-emitting layer disposed between the anode and the cathode, a portion of a hole transport layer disposed between the anode and the light-emitting layer, and a portion of a hole transport layer-protecting layer disposed between the hole transport layer and the light-emitting layer. The light-emitting devices include first light-emitting devices including first light-emitting layers emitting red light, second light-emitting devices including second light-emitting layers emitting green light, and third light-emitting devices including third light-emitting layers emitting blue light. It is very difficult to simultaneously form the first, second, and third light-emitting layers; hence, the first, second, and third light-emitting layers need to be sequentially formed depending on the color of the light emitted therefrom. Although the time taken from the completion of the hole transport layer to the formation of the primary ones is short, the time taken from the completion of the hole transport layer to the formation of the secondary or tertiary ones is long. Therefore, there is a great advantage in that the hole transport layer-protecting layer is formed over the hole transport layer to prevent the hole transport layer from being degraded.

In the organic EL unit according to the second aspect, the hole transport layer-protecting layer may be made of a host material used to form the third light-emitting layers, a host material used to form the second light-emitting layers, or a host material used to form the first light-emitting layers. When being made of one of the host materials, the hole transport layer-protecting layer, unlike a layer made of a hole transport material, can be prevented from being rapidly deteriorated even if surface portions of the hole transport layer-protecting layer are degraded and electrons and/or excitons migrating from the first to third light-emitting layers are trapped at trapping sites formed in the degraded surface portions. Furthermore, the use of one of the host materials to form the hole transport layer-protecting layer allows the energy gap between the HOMO or LUMO level of each of the first to third light-emitting layers and that of the hole transport layer-protecting layer to be minimized. This prevents the electrons and holes from accumulating at the interfaces between the hole transport layer-protecting layer and the first to third light-emitting layers, thereby preventing the deterioration of the interfaces therebetween.

A method for manufacturing the organic EL unit according to the second aspect includes forming the hole transport layer over the anodes such that the hole transport layer is common to the light-emitting devices; forming the hole transport layer-protecting layer on the hole transport layer such that the hole transport layer-protecting layer is common to the light-emitting devices; forming the second and third light-emitting layers on the hole transport layer-protecting layer; forming the first light-emitting layers on the hole transport layer-protecting layer after the formation of the second and third light-emitting layers; and forming an electron injection layer over the first, second, and third light-emitting layers. The second and third light-emitting layers are more adversely affected by the degradation of the hole transport layer as compared to the first light-emitting layers and therefore are significantly reduced in lifetime by the degradation thereof. Even if the hole transport layer-protecting layer is slightly contaminated, the second and third light-emitting layers may be adversely affected and therefore may be reduced in lifetime. If being not covered with the electron injection layer, the first light-emitting layers are more seriously deteriorated as compared to the second and third light-emitting layers. Since the first light-emitting layers are formed on the hole transport layer-protecting layer after the completion of the second and third light-emitting layers, the time taken from the completion of the hole transport layer-protecting layer to the formation of the second and third light-emitting layers can be reduced and the time taken from the completion of the first light-emitting layers to the formation of the electron transport layer can be also reduced. This allows the first to third light-emitting layers to have a long lifetime. The electron transport layer may have a function of transporting electrons and a function of injecting the electrons.

In the above method, after the third light-emitting layers are formed, the second light-emitting layers are preferably formed. The lifetime of the third light-emitting layers is far less than that of the second light-emitting layers; hence, the third light-emitting layers are more adversely affected by the contamination of the hole transport layer-protecting layer as compared to the second light-emitting layers. The formation of the third light-emitting layers in advance of the formation of the second light-emitting layers allows the from the completion of the hole transport layer-protecting layer to the formation of the third light-emitting layers to be reduced. This results in an increase in the lifetime of the organic EL unit.

An electronic apparatus according to a third aspect of the present invention includes the organic EL unit according to the first or second aspect. The electronic apparatus therefore has a long lifetime. Examples of the electronic apparatus include various apparatus each including a display including the organic EL unit according to the first or second aspect, various apparatus each including a lighting system including the organic EL unit according to the first or second aspect, and electrophotographic printers each including an exposure system including the organic EL unit according to the first or second aspect.

BRIEF DESCRIPTION OF THE DRAWINGS

The invention will be described with reference to the accompanying drawings, wherein like numbers reference like elements.

DESCRIPTION OF EXEMPLARY EMBODIMENTS

Embodiments of the present invention will now be described with reference to the accompanying drawings. The ratio between the sizes of members or portions shown in the drawings is different from the ratio between the sizes of actual ones.

First Embodiment

Figure 1:
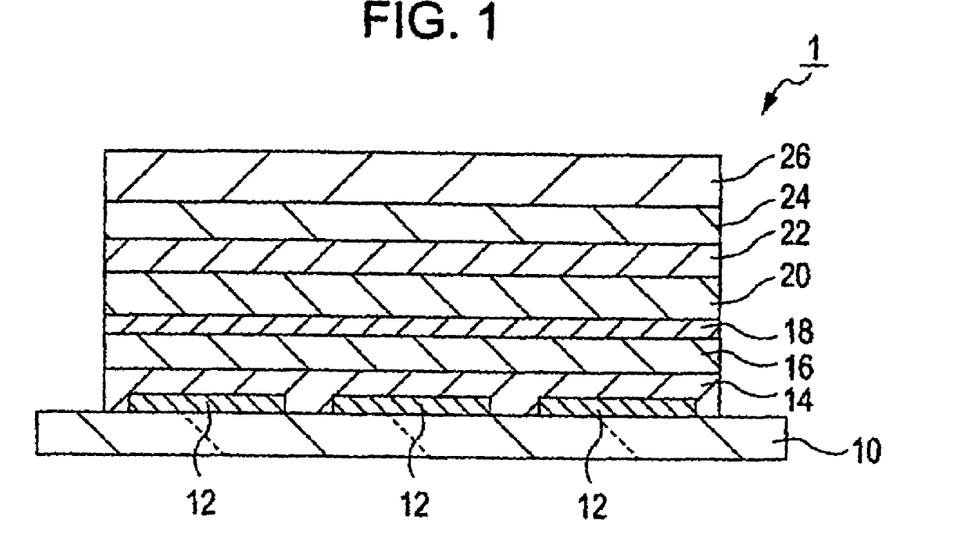
FIG. 1 is a schematic sectional view of an organic EL unit according to a first embodiment of the present invention.
Figure 2:
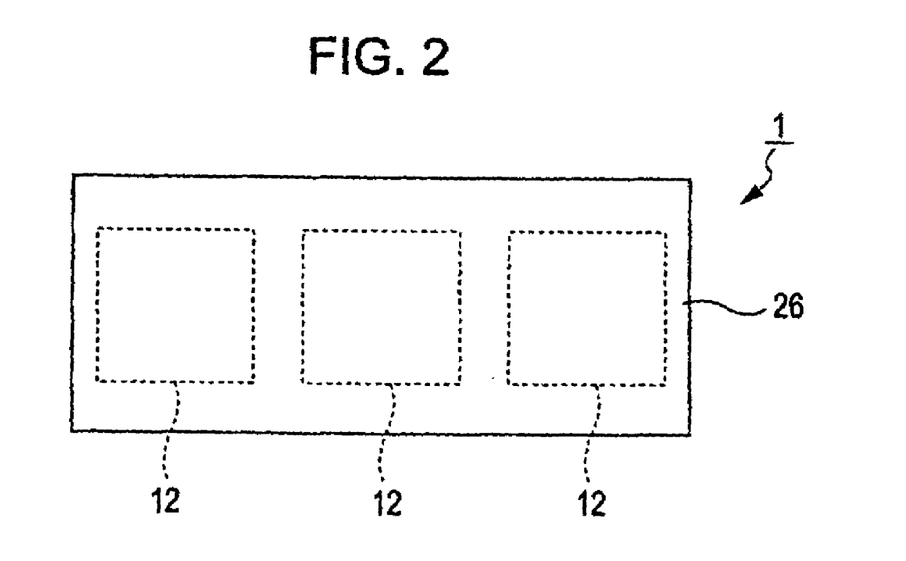
FIG. 2 is a schematic plan view of the organic EL unit shown in FIG. 1.

FIG. 1 is sectional view of an organic EL unit 1 according to a first embodiment of the present invention. FIG. 2 is a plan view of the organic EL unit 1. The organic EL unit 1 includes a substrate 10, anodes 12, a hole injection layer 14, a hole transport layer 16, a hole transport layer-protecting layer 18, a light-emitting layer 20, an electron transport layer 22, an electron injection layer 24, and a cathode 26, these members being arranged in that order as shown in FIG. 1. The organic EL unit 1 is used as a monochrome display.

In the organic EL unit 1, the anodes 12 are arranged to correspond to a plurality of pixels (light-emitting devices). The anodes 12 function as pixel electrodes corresponding to the pixels. FIGS. 1 and 2 each show only three of the anodes 12; however, the number of the anodes 12 arranged in the organic EL unit 1 is greater than three. The hole injection layer 14, the cathode 26, and the layers disposed therebetween are each common to the pixels.

The organic EL unit 1, which is schematically shown in FIG. 1, further includes thin-film transistors (TFTs) and wires for supplying power to the pixels and also includes an inorganic insulating layer extending thereover, these members being not shown and being arranged above the substrate 10. Furthermore, the organic EL unit 1 may include a known separator, which is not shown.

The organic EL unit 1 may be of a bottom, top, or dual emission type. When the organic EL unit 1 is of a bottom or dual emission type, the substrate 10 is preferably made of a transparent material such as glass. When the organic EL unit 1 is of a top emission type, the substrate 10 is preferably made of a transparent material or an opaque material such as ceramic or metal.

A material for forming the anodes 12 and the thickness thereof may be appropriately selected depending on the emission type of the organic EL unit 1. When the anodes 12 need to be transparent, the anodes 12 are made of a transparent material such as indium tin oxide (ITO) or made from a highly conductive metal or alloy so as to have an extremely small thickness. When the anodes 12 need not be transparent, the anodes 12 are made from a highly conductive metal or alloy so as to have a large thickness.

A material for forming the cathode 26 and the thickness thereof may be appropriately selected depending on the emission type of the organic EL unit 1. When the cathode 26 needs to be transparent, the cathode 26 is made of a transparent material such as indium tin oxide (ITO) or made from a highly conductive metal or alloy so as to have an extremely small thickness. When the cathode 26 need not be transparent, the cathode 26 is made from a highly conductive metal or alloy so as to have a large thickness.

In order to protect the light-emitting layer 20 and other members of the organic EL unit 1 from moisture and oxygen, the cathode 26 may be covered with a known sealing layer, which is not shown, or the substrate 10 may have a known sealing cap, which is not shown, bonded thereto. In the case where the organic EL unit 1 is used as a color display, color filters may be arranged on the light-emitting side of the organic EL unit 1.

A method for manufacturing the organic EL unit 1 will now be described. In this embodiment, the light-emitting layer 20 is formed using low-molecular-weight materials. The anodes 12, the cathode 26, and the layers disposed therebetween are formed in a vacuum by a deposition process such as vapor deposition.

The TFTs and wires, which are not shown, are formed above the substrate 10 and the inorganic insulating layer is formed over the TFTs and the wires. After through-holes for connecting the TFTs to the anodes 12 are formed in the inorganic insulating layer, the anodes 12 are formed on the inorganic insulating layer. With reference to FIG. 2, the anodes 12 have a rectangular shape and are arranged above the substrate 10. The hole injection layer 14 is formed over the anodes 12. The hole transport layer 16 and the hole transport layer-protecting layer 18 are formed on the hole injection layer 14 in that order.

The light-emitting layer 20, the electron transport layer 22, the electron injection layer 24, and the cathode 26 are formed on the hole transport layer-protecting layer 18 in that order.

An example of the manufacturing method will now be described in detail.

The substrate 10 is formed from glass so as to have a thickness of about 1 mm. The anodes 12 are formed so as to have a thickness of about 30 nm using ITO. The hole injection layer 14 is formed over the anodes 12 so as to have a thickness of about 20 nm using copper phthalocyanine (CuPc). The hole transport layer 16 is formed so as to have a thickness of about 20 nm using N,N'-bis(1-naphthyl)-N,N'-diphenyl-4,4'-biphenyl (NPD). The hole transport layer-protecting layer 18 is formed so as to have a thickness of about 5 nm using a host material, such as the product "BH-215" available from Idemitsu Kosan Co., Ltd., used to form the light-emitting layer 20. The hole transport layer-protecting layer 18 is preferably thinner than the hole transport layer 16 and the light-emitting layer 20.

The light-emitting layer 20 is formed by co-depositing the host material and dopants such as the products "BD-102", "GD-206", and "RD-001" available from Idemitsu Kosan Co., Ltd. so as to have a thickness of about 30 nm.

The electron transport layer 22 is formed so as to have a thickness of about 20 nm using tris(8-quinolinolato) aluminum (Alq3). The electron injection layer 24 is formed so as to have a thickness of about 1 nm using lithium fluoride (LiF). The cathode 26 is formed so as to have a thickness of about 100 nm using aluminum.

In this embodiment, the hole transport layer-protecting layer 18 and the light-emitting layer 20 are formed using the host material as described above. The host material has higher exciton resistance and electron resistance as compared to a hole transport material. Therefore, the hole transport layer-protecting layer 18, unlike a layer formed using the hole transport material, is not rapidly deteriorated even if surface portions of the hole transport layer-protecting layer 18 are degraded and electrons and/or excitons migrating from the light-emitting layer 20 are trapped at trapping sites formed in the degraded surface portions. The use of the host material to form the hole transport layer-protecting layer 18 and the light-emitting layer 20 allows the energy gap between the HOMO or LUMO level of the light-emitting layer 20 and that the hole transport layer-protecting layer 18 to be minimized. This prevents the electrons and holes from accumulating at the interface between the hole transport layer-protecting layer 18 and the light-emitting layer 20, thereby preventing the deterioration of the interface therebetween. Unlike the hole transport material, the host material, which is used to form the hole transport layer-protecting layer 18 and the light-emitting layer 20, is expected to be not contaminated with a slight amount of oxygen, moisture, particles, or another contaminant in an atmosphere. The host material is transparent. Since the hole transport layer-protecting layer 18 and the light-emitting layer 20 are formed using the host material, the light-emitting layer 20 can be adapted to the hole transport layer-protecting layer 18.

The hole transport layer-protecting layer 18 needs to meet requirements below. That is, the hole transport layer-protecting layer 18 needs to emit no light, needs to cause no significant reduction in the ability of the hole transport layer 16, needs to be hardly contaminated with oxygen or moisture, needs to be transparent, and needs to be formed within a short time after the completion of the hole transport layer 16. Therefore, the host material is suitable for the hole transport layer-protecting layer 18. Any material meeting these requirements may be used to form the hole transport layer-protecting layer 18 instead of the host material.

In this embodiment, CuPc is used to form the hole injection layer 14; however, the product "HI-406" available from Idemitsu Kosan Co., Ltd. may be used instead. The product "HT-320" available from Idemitsu Kosan Co., Ltd. may be used to form the hole transport layer-protecting layer 18 instead of NPD.

Second Embodiment

Figure 4:
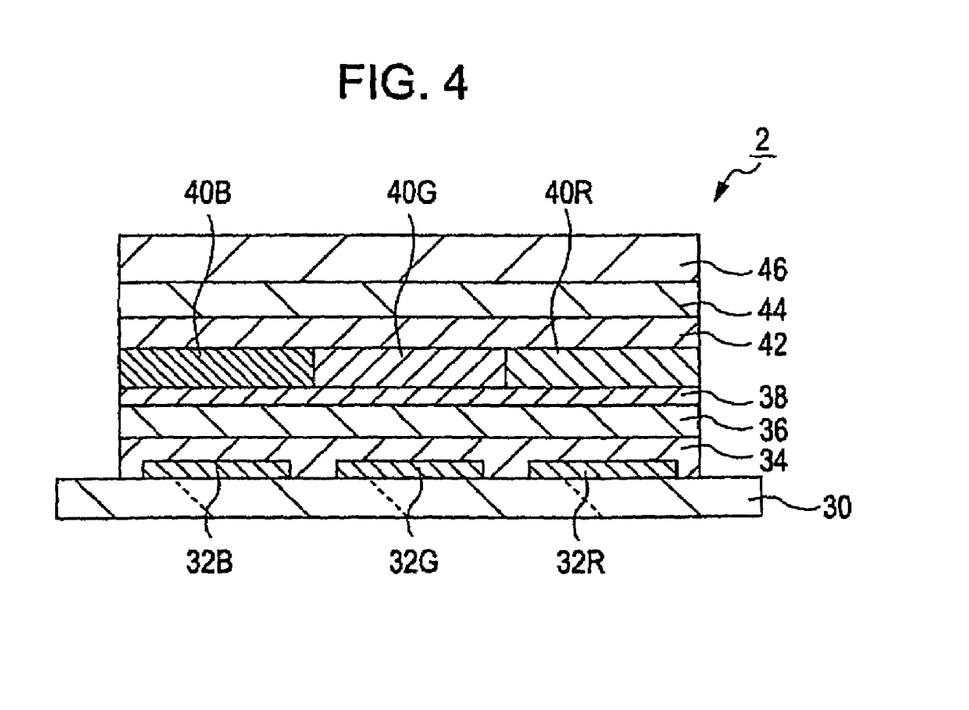
FIG. 4 is a schematic sectional view of an organic EL unit according to a second embodiment of the present invention.
Figure 5:
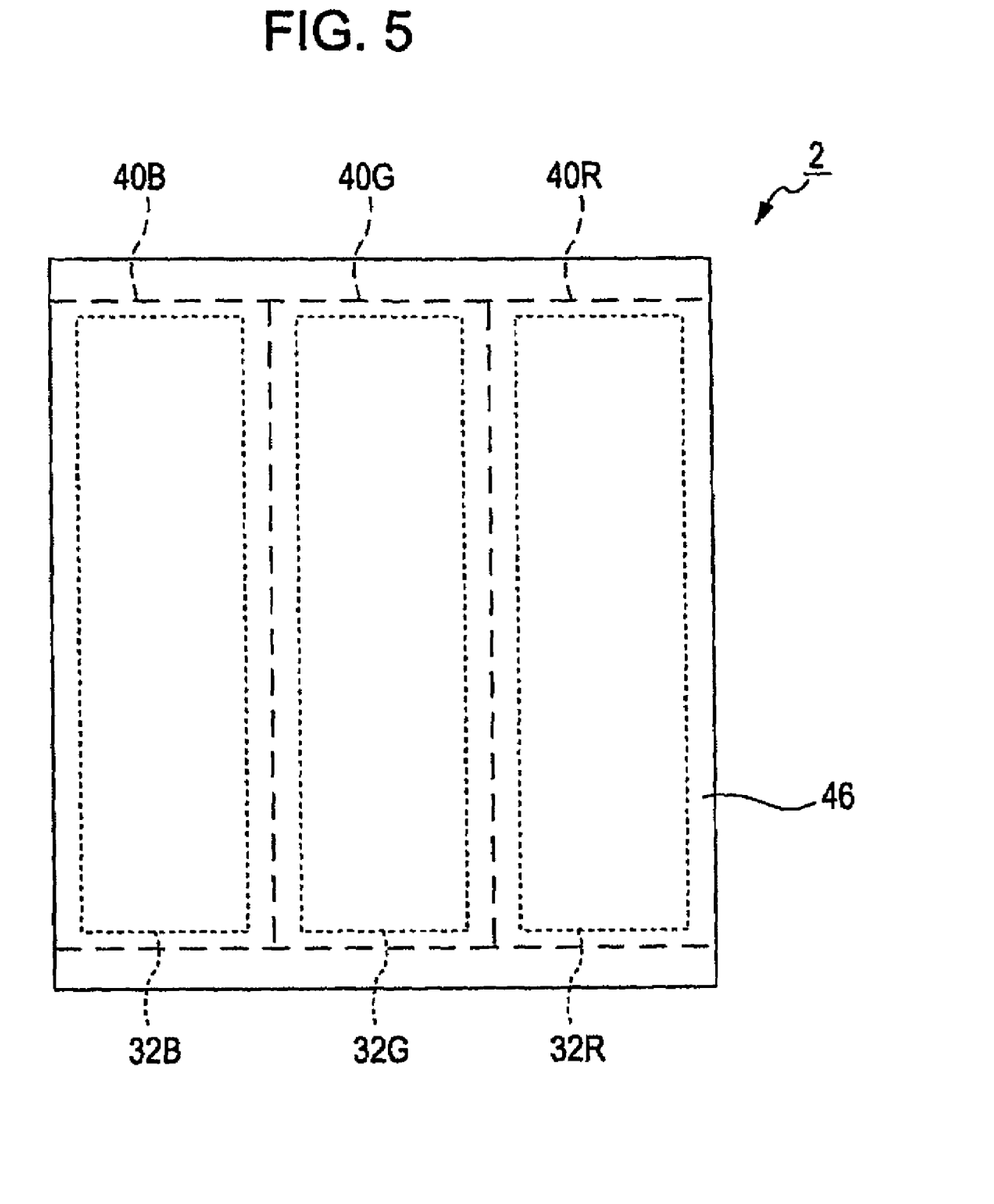
FIG. 5 is a schematic plan view of the organic EL unit shown in FIG. 4.

FIG. 4 is a schematic sectional view of an organic EL unit 2 according to a second embodiment of the present invention. FIG. 5 is a plan view of the organic EL unit 2. The organic EL unit 2 includes a substrate 30, anodes 32, a hole injection layer 34, a hole transport layer 36, a hole transport layer-protecting layer 38, light-emitting layers 40, an electron transport layer 42, an electron injection layer 44, and a cathode 46. These members are arranged in the order shown in FIG. 4. The organic EL unit 2 is used as a full-color display.

With reference to FIG. 5, the anodes 32 (32R, 32G, and 32B) are arranged in the organic EL unit 2 so as to correspond to a plurality of pixels (light-emitting devices). The anodes 32 function as pixel electrodes corresponding to the pixels. FIGS. 4 and 5 each show only three of the anodes 32; however, the number of the anodes 32 is greater than three. The anodes 32R correspond to the pixels of red, the anodes 32G correspond to the pixels of green, and the anodes 32B correspond to the pixels of blue. The anodes 32 (32R, 32G, and 32B) may be made of the same material and may have the same size.

The light-emitting layers 40 (40R, 40G, and 40B) are arranged to correspond to the pixels. The light-emitting layers 40R correspond to the red pixels, emit red light, and overlie the anodes 32R. The light-emitting layers 40G correspond to the green pixels, emit green light, and overlie the anodes 32G. The light-emitting layers 40B correspond to the blue pixels, emit blue light, and overlie the anodes 32B. FIGS. 4 and 5 each show only three of the anodes 32 and three of the light-emitting layers 40; however, the number of the anodes 32 and that of the light-emitting layers 40 are each greater than three. The following members are each common to the pixels: the hole injection layer 34, the hole transport layer 36, the hole transport layer-protecting layer 38, the electron transport layer 42, the electron injection layer 44, and the cathode 46.

The organic EL unit 2, which is schematically shown in FIG. 4, further includes TFTs and wires for supplying power to the pixels and also includes an inorganic insulating layer extending thereover, these members being not shown and being arranged above the substrate 30. Furthermore, the organic EL unit 2 may include a known separator, which is not shown.

The organic EL unit 2 may be of a bottom, top, or dual emission type. A material for forming the substrate 30 may be selected on the same basis as that used for the substrate 10 described in the first embodiment. A material for forming the anodes 32, as well as the anodes 12 described in the first embodiment, and the thickness thereof may be selected depending on the emission type of the organic EL unit 2. Furthermore, a material for forming the cathode 46, as well as the cathode 26 described in the first embodiment, and the thickness thereof may be selected depending on the emission type of the organic EL unit 2.

In order to protect the light-emitting layers 40 and other members of the organic EL unit 2 from moisture and oxygen, the cathode 46 may be covered with a known sealing layer, which is not shown, or a known sealing cap, which is not shown, may be bonded to the substrate 30. In order to enhance the color purity of the light emitted from the organic EL unit 2, color filters may be arranged on the light-emitting side of the organic EL unit 2.

A method for manufacturing the organic EL unit 2 will now be described. The light-emitting layers 40 are formed using low-molecular-weight materials. The anodes 32, the cathode 46, and the layers disposed therebetween are formed in a vacuum by a deposition process such as vapor deposition.

The TFTs and wires, which are not shown, are formed above the substrate 30 and the inorganic insulating layer is formed over the TFTs and the wires. After through-holes for connecting the TFTs to the anodes 32 are formed in the inorganic insulating layer, the anodes 32 (32R, 32G, and 32B) are formed on the inorganic insulating layer separately depending on the color of the pixels. In this embodiment, the anodes 32 have a rectangular shape. The hole injection layer 34 is formed over the anodes 32. The hole transport layer 36 and the hole transport layer-protecting layer 38 are formed on the hole injection layer 34 in that order.

The light-emitting layers 40B emitting blue light, the light-emitting layers 40G emitting green light, and the light-emitting layers 40R emitting red light are formed on the hole transport layer-protecting layer 38 in that order. The electron transport layer 42 is formed over the light-emitting layers 40R, 40G, and 40B. The electron injection layer 44 and the cathode 46 are formed on the electron injection layer 44 in that order.

An example of the manufacturing method will now be described in detail. The example is not intended to limit the present invention.

The substrate 30 may be formed from glass so as to have a thickness of about 1 mm. The anodes 32 may be formed so as to have a thickness of about 30 nm using ITO. The hole injection layer 34 may be formed over the anodes 32 so as to have a thickness of about 20 nm using CuPc or the product "HI-406" available from Idemitsu Kosan Co., Ltd. The hole transport layer 36 may be formed so as to have a thickness of about 20 nm using NPD or the product "HT-320", available from Idemitsu Kosan Co., Ltd.

The hole transport layer-protecting layer 38 may be formed so as to have a thickness of about 5 nm using a first host material, such as the product "BH-215" available from Idemitsu Kosan Co., Ltd., used to form the light-emitting layers 40B emitting blue light and the light-emitting layers 40G emitting green light. The first host material can be used to form the light-emitting layers 40R emitting red light. Alternatively, the hole transport layer-protecting layer 38 may be formed so as to have a thickness of about 5 nm using a second host material, such as Alq3, used to form the light-emitting layers 40R emitting red light. The hole transport layer-protecting layer 38 is preferably thinner than the hole transport layer 36 and the light-emitting layers 40.

The light-emitting layers 40B emitting blue light may be formed by co-depositing the first host material and a first dopant such as the product "BD-102" available from Idemitsu Kosan Co., Ltd. so as to have a thickness of about 30 nm.

The light-emitting layers 40G emitting green light may be formed by co-depositing the first host material and a second dopant such as the product "GD-206" available from Idemitsu Kosan Co., Ltd. so as to have a thickness of about 30 nm.

The light-emitting layers 40R emitting red light may be formed by co-depositing the first host material and a third dopant such as the product "RD-001" available from Idemitsu Kosan Co., Ltd. or co-depositing the third dopant and the second host material so as to have a thickness of about 30 nm.

The electron transport layer 42 may be formed so as to have a thickness of about 20 nm using Alq3. The electron injection layer 44 may be formed so as to have a thickness of about 1 nm using LiF. The cathode 46 may be formed so as to have a thickness of about 100 nm using aluminum.

It is very difficult to simultaneously form the light-emitting layers 40R, 40G, and 40B. In the case where the light-emitting layers 40R, 40G, and 40B are formed by vapor deposition, one of each light-emitting layer 40R, light-emitting layer 40G, and light-emitting layer 40B is formed in such a manner that regions for forming the others are masked and this operation is repeated. Therefore, the time taken from the completion of the hole transport layer 36 to the formation of those other than the primarily formed one is long, because the light-emitting layers 40R, 40G, and 40B need to be sequentially formed depending on the color of the light emitted therefrom after the hole transport layer 36 is formed. There is a great advantage in that the hole transport layer-protecting layer 38 is formed over the hole transport layer 36 to prevent the hole transport layer 36 from being degraded. Therefore, the light-emitting layers 40 have a long lifetime.

The hole transport layer-protecting layer 38 may be formed using the first host material, which is used to form the light-emitting layers 40B emitting blue light and the light-emitting layers 40G emitting green light, or the second host material, which is used to form the light-emitting layers 40R emitting red light, as described above. The first and second host materials have higher exciton resistance and electron resistance as compared to hole transport materials. The hole transport layer-protecting layer 38, unlike layers formed using the hole transport materials, is not rapidly deteriorated even if surface portions of the hole transport layer-protecting layer 38 are degraded and/or excitons migrating from the light-emitting layers 40 are trapped at trapping sites formed in the degraded surface portions. The use of the first or second host material to form the hole transport layer-protecting layer 18 allows the energy gap between the HOMO or LUMO level of each light-emitting layer 40 and that of the hole transport layer-protecting layer 39 to be minimized. This prevents the electrons and holes from accumulating at the interface between the hole transport layer-protecting layer 38 and the light-emitting layers 40, thereby preventing the deterioration of the interface therebetween. Unlike the hole transport materials, the first and second host materials are expected to be not contaminated with a slight amount of oxygen, moisture, particles, or another contaminant in an atmosphere. The first and second host materials are transparent. The use of the first or second host material to form the hole transport layer-protecting layer 38 allows the light-emitting layers 40 to be adapted to the hole transport layer-protecting layer 38. Therefore, the first or second host material is preferably used to form the hole transport layer-protecting layer 38. However, any material having properties meeting the requirements for the hole transport layer-protecting layer 18 described in the first embodiment may be used to form the hole transport layer-protecting layer 38 instead of the first or second host material.

In the above manufacturing method, the light-emitting layers 40B emitting blue light, the light-emitting layers 40G emitting green light, and the light-emitting layers 40R emitting red light are formed in that order after the completion of the hole transport layer-protecting layer 38. This is because as described below.

The light-emitting layers 40B emitting blue light and the light-emitting layers 40G emitting green light are more significantly reduced in lifetime by the degradation of the hole transport layer 36 as compared to the light-emitting layers 40R emitting red light. Although the hole transport layer-protecting layer 38 is disposed on the hole transport layer 36, the light-emitting layers 40B emitting blue light and the light-emitting layers 40G emitting green light may be reduced in lifetime if the hole transport layer-protecting layer 38 is only slightly contaminated. The light-emitting layers 40R emitting red light are more significantly deteriorated as compared to the light-emitting layers 40B emitting blue light and the light-emitting layers 40G emitting green light if the light-emitting layers 40R emitting red light are not covered with the electron transport layer 42 immediately after the completion of the light-emitting layers 40R emitting red light. Since the light-emitting layers 40R emitting red light are formed after the completion of the light-emitting layers 40B emitting blue light and the light-emitting layers 40G emitting green light, the time taken from the completion of the hole transport layer-protecting layer 38 to the formation of the light-emitting layers 40B emitting blue light and the light-emitting layers 40G emitting green light can be reduced and the time taken from the completion of the light-emitting layers 40R emitting red light to the formation of the electron transport layer 42 can be also reduced. This probably allows the light-emitting layers 40 to have a long lifetime.

The lifetime of the light-emitting layers 40B emitting blue light is far less than that of the light-emitting layers 40G emitting green light; hence, if the hole transport layer-protecting layer 38 is only slightly contaminated, the light-emitting layers 40B emitting blue light is more seriously affected by the contamination of the hole transport layer-protecting layer 38 as compared to the light-emitting layers 40G emitting green light. Since the light-emitting layers 40B emitting blue light is formed in advance of light-emitting layers 40G emitting green light, the time taken from the completion from the formation of the light-emitting layers 40B emitting blue light can be reduced. This allows the organic EL unit 2 to have a long lifetime. That is, the manufacturing method according to the present invention allows the organic EL unit 2 to have a long lifetime.

Third Embodiment

Figure 6:
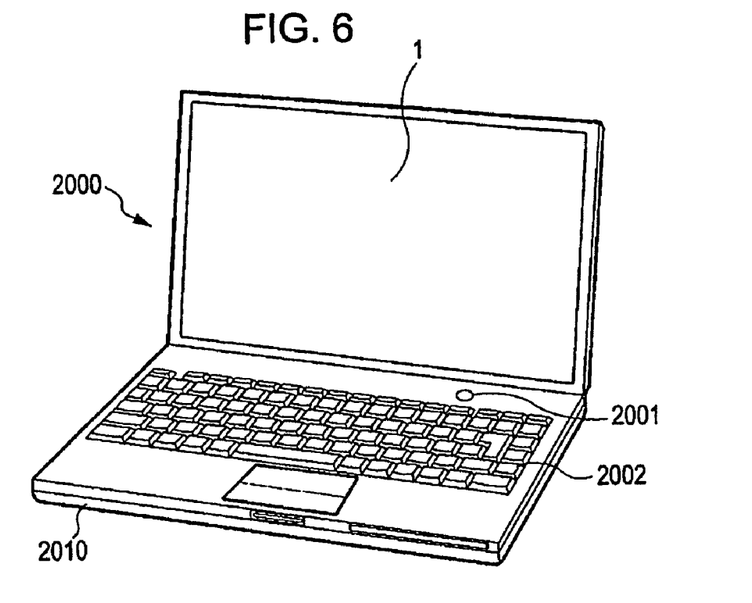
FIG. 6 is a perspective view of a mobile personal computer including the organic EL unit according to the first or second embodiment, the organic EL unit being used as a display.

An electronic apparatus according to a third embodiment of the present invention includes the organic EL unit 1 or 2 according to the first or second embodiment, respectively. Examples of the electronic apparatus will now be described. FIG. 6 shows a mobile personal computer 2000 in perspective view. The mobile personal computer 2000 includes the organic EL unit 1 or 2, which is used as a display, and a body section 2010. The body section 2010 includes a power switch 2001 and a keyboard 2002.

Figure 7:
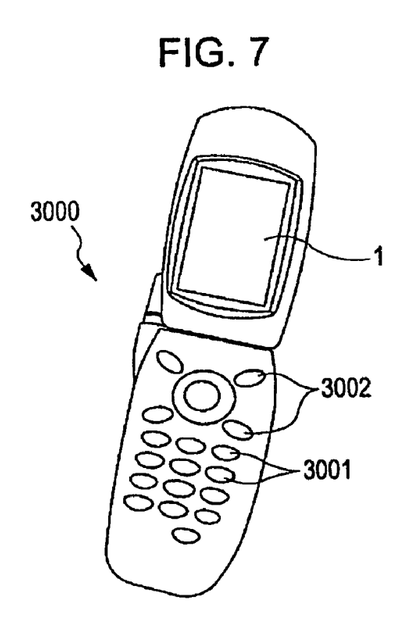
FIG. 7 is a perspective view of a mobile phone including the organic EL unit according to the first or second embodiment, the organic EL unit being used as a display.

FIG. 7 shows a mobile phone 3000. The mobile phone 3000 includes a plurality of operation buttons 3001, scroll buttons 3002, and the organic EL unit 1 or 2, which is used as a display. The operation of the scroll buttons 3002 allows an image displayed on the organic EL unit 1 or 2 to be scrolled.

Figure 8:
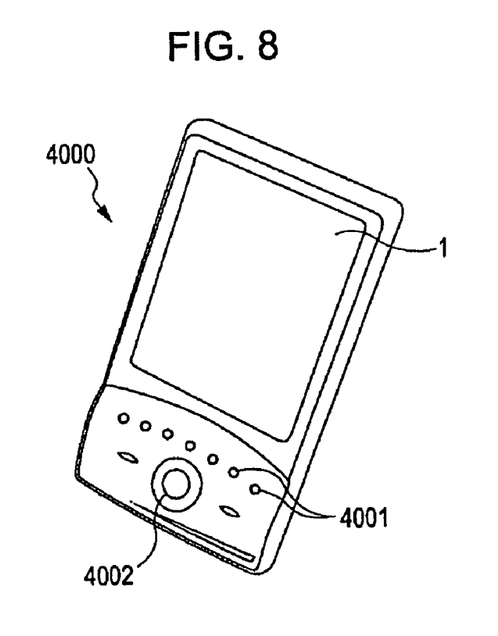
FIG. 8 is a perspective view of a personal digital assistant including the organic EL unit according to the first or second embodiment, the organic EL unit being used as a display.

FIG. 8 shows a personal digital assistant (PDA) 4000. The PDA 4000 includes a plurality of operation buttons 4001, a power switch 4002, and the organic EL unit 1 or 2, which is used as a display. The operation of the power switch 4002 allows various pieces of information such as addresses and schedules to be displayed on the organic EL unit 1 or 2.

Examples of the electronic apparatus include digital still cameras, televisions, video cameras, car navigation systems, pagers, electronic notebooks, electronic paper displays, portable electronic calculators, word processors, work stations, video phones, point-of-sale (POS) terminals, video players, touch panel-including apparatuses, electrophotographic printers, and lighting systems in addition to those shown in FIGS. 6 to 8. The electrophotographic printers each include a printer head, including a light source including the organic EL unit 1 or 2, for forming an electrostatic latent image by irradiating an image carrier with light.

Other Embodiments

The hole injection layer 14 and hole transport layer 16 included in the organic EL unit 1 according to the first embodiment may be replaced with a single layer having the same functions as those of these layers. The hole injection layer 34 and hole transport layer 36 included in the organic EL unit 2 according to the second embodiment may be replaced with a single layer having the same functions as those of these layers. Furthermore, the electron transport layer 22 and electron injection layer 24 included in the organic EL unit 1 according to the first embodiment may be replaced with a single layer having the same functions as those of these layers. The electron transport layer 42 and electron injection layer 44 included in the organic EL unit 2 according to the second embodiment may be replaced with a single layer having the same functions as those of these layers.

The organic EL units 1 and 2 according to first and second embodiments may further include a functional layer within the scope of the present invention.

In the organic EL unit 1 according to the first embodiment, the anodes 12, the cathode 26, and the layers arranged therebetween are formed in a vacuum by a deposition process such as vapor deposition as described above and may be formed by a liquid-feeding process such as an ink jet process or a dispensing process. In the organic EL unit 2 according to the second embodiment, the anodes 32, the cathode 46, and the layers arranged therebetween are formed in a vacuum by a deposition process such as vapor deposition as described above and may be formed by a liquid-feeding process such as an ink jet process or a dispensing process.

EXAMPLES

Example 1

A sample having the same configuration as that of the organic EL unit 1 according to the first embodiment was prepared and then evaluated for brightness. The change in brightness of the sample with time was illustrated in FIG. 3 with a solid line, the change being normalized with the initial brightness of the sample.

The sample, as well as the organic EL unit 1 according to the first embodiment, included a hole transport layer 16, a light-emitting layer 20, and a hole transport layer-protecting layer 18 disposed therebetween; hence, the hole transport layer 16 was protected by the presence of the hole transport layer-protecting layer 18 from being degraded. The hole transport layer-protecting layer 18 was made of a single material. Therefore, the hole transport layer-protecting layer 18 was capable of being formed within a short time after the completion of the hole transport layer 16 because it was not necessary to wait until the deposition rates of materials used for co-deposition were stabilized. This prevented the hole transport layer 16 from being degraded. The presence of the hole transport layer-protecting layer 18 between the hole transport layer 16 and the light-emitting layer 20 was effective in preventing the light-emitting layer 20 from being adversely affected by the hole transport layer 16. This allowed the light-emitting layer 20 to have a long lifetime as shown in FIG. 3.

Comparative Example 1

A sample having substantially the same configuration as that of the organic EL unit 1 according to the first embodiment was prepared except that the sample included no hole transport layer-protecting layer 18. The sample was evaluated for brightness. The change in brightness of the sample with time was illustrated in FIG. 3 with a broken line, the change being normalized with the initial brightness of the sample.

Figure 3:
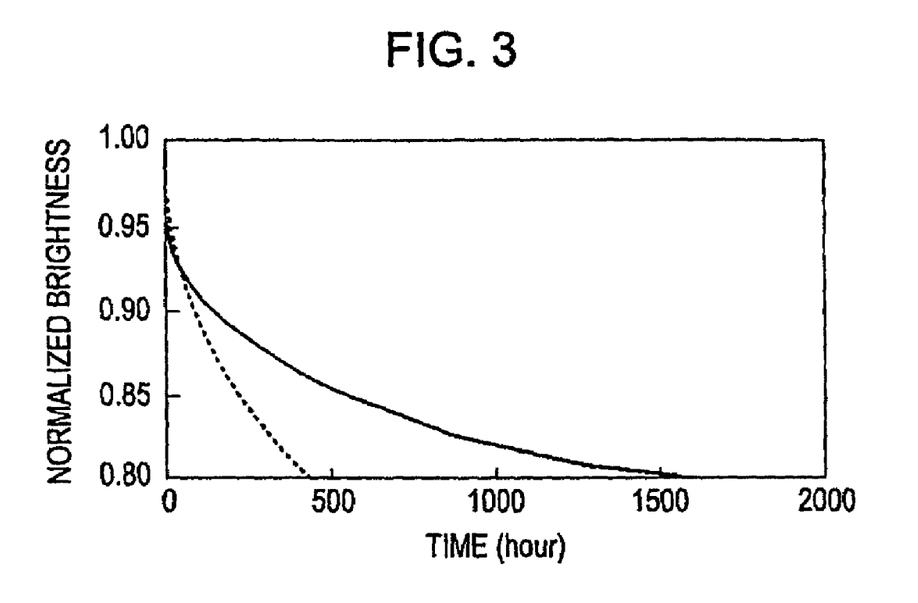
FIG. 3 is a graph showing the change in brightness of samples of Example 1 and Comparative Example 1.

The brightness of this sample was more seriously reduced as compared to that of the sample of Example 1 as shown in FIG. 3. The reason for this phenomenon is not clear; however, the inventors assume the reason to be as follows: the surface of a hole transport layer 16 included in this sample is degraded with time after the completion of the hole transport layer 16 and the lifetime of a light-emitting layer 20 included in this sample is reduced by the affect of the degraded hole transport layer 16 because the light-emitting layer 20 is directly disposed on the degraded hole transport layer 16. The light-emitting layer 20 is formed by the co-deposition of a plurality of materials and therefore it takes a long time to stabilize the deposition rates of the materials. Hence, the light-emitting layer 20 cannot be formed immediately after the completion of the hole transport layer 16. This leads to the degradation of the hole transport layer 16.

What is claimed is:

1. An organic electroluminescent unit comprising:
   an anode;
   a cathode;
   a light-emitting layer disposed between the anode and the cathode;
   a hole transport layer disposed between the anode and the light-emitting layer, wherein the hole transport layer is made of a wholly organic material; and
   a hole transport layer-protecting layer disposed between the hole transport layer and the light-emitting layer, wherein the hole transport layer-protecting layer is made of a host material used to form the light-emitting layer.

2. An organic electroluminescent unit comprising:
   a plurality of light-emitting devices each including an anode, a portion of a cathode, a light-emitting layer disposed between the anode and the cathode, a portion of a hole transport layer disposed between the anode and the light-emitting layer, and a portion of a hole transport layer-protecting layer disposed between the hole transport layer and the light-emitting layer,
   wherein the hole transport layer is made of a wholly organic material; and
   the light-emitting devices include first light-emitting devices including first light-emitting layers emitting red light, second light-emitting devices including second light-emitting layers emitting green light, and third light-emitting devices including third light-emitting layers emitting blue light, wherein the hole transport layer-protecting layer is made of a host material used to form the third light-emitting layers.

3. An organic electroluminescent unit comprising:
   a plurality of light-emitting devices each including an anode, a portion of a cathode, a light-emitting layer disposed between the anode and the cathode, a portion of a hole transport layer disposed between the anode and the light-emitting layer, and a portion of a hole transport layer-protecting layer disposed between the hole transport layer and the light-emitting layer,
   wherein the hole transport layer is made of a wholly organic material; and
   the light-emitting devices include first light-emitting devices including first light-emitting layers emitting red light, second light-emitting devices including second light-emitting layers emitting green light, and third light-emitting devices including third light-emitting layers emitting blue light, wherein the hole transport layer-protecting layer is made of a host material used to form the second light-emitting layers.

4. An organic electroluminescent unit comprising:
a plurality of light-emitting devices each including an anode, a portion of a cathode, a light-emitting layer disposed between the anode and the cathode, a portion of a hole transport layer disposed between the anode and the light-emitting layer, and a portion of a hole transport layer-protecting layer disposed between the hole transport layer and the light-emitting layer,
wherein the hole transport layer is made of a wholly organic material; and
the light-emitting devices include first light-emitting devices including first emitting layers emitting red light, second light-emitting devices including second light-emitting layers emitting green light, and third light-emitting devices including third light-emitting layers emitting blue light, wherein the hole transport layer-protecting layer is made of a host material used to form the first light-emitting layers.

5. A method for manufacturing an organic electroluminescent unit including a plurality of light-emitting devices each including an anode, a portion of a cathode, a light-emitting layer disposed between the anode and the cathode, a portion of a hole transport layer disposed between the anode and the light-emitting layer, and a portion of a hole transport layer-protecting layer disposed between the hole transport layer and the light-emitting layer wherein the hole transport layer is made of a wholly organic material and the light-emitting devices include first light-emitting devices including first light-emitting layers emitting red light, second light-emitting devices including second light-emitting layers emitting green light, and third light-emitting devices including third light-emitting layers emitting blue light, the steps of the method comprising:
   forming the hole transport layer over a plurality of anodes such that the hole transport layer is common to the plurality of light-emitting devices;
   forming the hole transport layer-protecting layer on the hole transport layer such that the hole transport layer-protecting layer is common to the plurality of light-emitting devices;
   forming the second and third light-emitting layers on the hole transport layer-protecting layer;
   forming the first light-emitting layers on the hole transport layer-protecting layer after the formation of the second and third light-emitting layers, wherein the first light-emitting layers emit red light, the second light-emitting layers emit green light, and the third light-emitting layers emit blue light; and
   forming an electron injection layer over the first, second, and third light-emitting layers.

6. The method according to claim 5, wherein after the third light-emitting layers are formed, the second light-emitting layers are formed.

7. An electronic apparatus comprising the organic electroluminescent unit according to claim 1.

8. The organic electroluminescent unit according to claim 2, wherein the hole transport layer-protecting layer is made of a different material than the hole transport layer.

9. The organic electroluminescent unit according to claim 3, wherein the hole transport layer-protecting layer is made of a different material than the hole transport layer.

10. The organic electroluminescent unit according to claim 4, wherein the hole transport layer-protecting layer is made of a different material than the hole transport layer.

11. The organic electroluminescent unit according to claim 2, wherein the second and third light-emitting layers are made of a first host material and the first light-emitting layer is made of a second host material.

12. The organic electroluminescent unit according to claim 2, wherein the hole transport layer has a uniform thickness.

* * * * *